United States Patent [19]

Ibuka et al.

[11] Patent Number: 5,070,275
[45] Date of Patent: Dec. 3, 1991

[54] ION IMPLANTATION DEVICE

[75] Inventors: Shigehito Ibuka, Kofu; Hisashi Kondo, Yamanashi; Shigeru Sagami; Koji Sumi, both of Tokyo, all of Japan

[73] Assignee: Tokyo Electron Limited, Tokyo, Japan

[21] Appl. No.: 540,117

[22] Filed: Jun. 19, 1990

[30] Foreign Application Priority Data

Jun. 29, 1989 [JP] Japan .................................. 1-168088

[51] Int. Cl.⁵ ............................................. H01J 27/02
[52] U.S. Cl. ............................ 315/111.81; 315/111.91; 250/423 R
[58] Field of Search ...................... 315/111.81, 111.91; 250/423 R, 492.2, 492.3

[56] References Cited

U.S. PATENT DOCUMENTS

| 4,124,802 | 11/1978 | Terasawa et al. | 250/423 R X |
| 4,560,879 | 12/1985 | Wu et al. | 250/423 R X |
| 4,634,931 | 1/1987 | Taya et al. | 315/111.81 |
| 4,782,304 | 11/1988 | Aitken | 250/423 R X |
| 4,881,010 | 11/1989 | Jetter | 315/111.81 |
| 4,883,969 | 11/1989 | Ishida et al. | 315/111.81 X |
| 4,893,019 | 1/1990 | Oomori et al. | 315/111.81 X |

Primary Examiner—Eugene R. LaRoche
Assistant Examiner—Do Hyun Yoo
Attorney, Agent, or Firm—Oblon, Spivak, McClelland, Maier & Neustadt

[57] ABSTRACT

An ion implantation device which is characterized in that source gas is supplied to an ion source from a gas cylinder provided in an external portion of the ion implantation device to maintain the cleanness of the clean room by reducing the frequency of exchanging gas cylinder for new one.

5 Claims, 2 Drawing Sheets

ION IMPLANTATION DEVICE

BACKGROUND OF THE INVENTION

1. Field of the Invention

The present invention relates to an ion implantation device.

2. Description of the Related Art

In general, ion implantation devices are widely used in doping impurity such as boron, phosphorus, arsenic to a semiconductor wafer.

In such conventional ion implantation devices such as an ion implantation device of a medium current type, a predetermined ion, which is generated by an ion source, is selected by a mass-spectrometry magnet, and accelerated by an accelerating tube. Thereafter, the ion is focused by a quadruple lens and is scanned and irradiated on a processing material, for example a semiconductor wafer, which is arranged in a platen as being scanned in an X - Y direction by an X - Y scanning electrode.

In the above-structured ion implantation device, as such an ion source, there is frequently used an ion source of a hot-cathode type forming a plasma by discharging source gas, thereby generating ions. Moreover, since a high voltage is applied to the ion source, the ion source and a unit such as a power source for supplying power to the ion source are contained in a cylindrical member, which is normally called an enclosure, in order to be electrically isolated from the outside. Also, there is provided a box, which is called a gas box, in the enclosure. In the gas box, there is contained a gas cylinder for supplying source gas to the ion source.

Therefore, the space where the gas cylinder is provided is limited, so that a large-sized gas cylinder can not be used. The gas cylinder of about 0.35 l is normally used. Therefore, the term for which one gas cylinder can be used is normally about one week to one month though this depends on frequency in use of gas cylinder. Therefore, one gas cylinder must be exchanged for a new one by a week or a month.

Moreover, it takes much time to perform the exchange of the gas cylinder for new on and the adjustment after the exchange. Specifically, down time of one or two days is normally generated in accordance with the exchange of the gas cylinder, so that productivity is worsened.

Furthermore, the ion implantation device is normally in a clean room. Several workers must enter the clean room for a certain period of time to perform the exchange of the gas cylinder for a new one and the adjustment after the exchange. Since the human body becomes a source where dust is generated, it is desirable that the frequencies of which the workers enter the clean room be reduced as possible. Particularly, there is a tendency for the semiconductor device to be highly integrated recently, and it has been required that cleanness in the clean room be improved more than the conventional one. For this reason, necessity for reducing the frequencies of which the workers enter the clean room has been raised. Also, since the clean room has an extremely narrow room, it can be said that the exchange of the gas cylinder always involves danger in view of safety.

SUMMARY OF THE INVENTION

An object of the present invention is to provide an ion implantation device wherein the frequencies of gas cylinder exchange can be largely reduced as compared with the prior art and the frequencies of worker's entering in the clean room for exchanging the gas cylinder with a new one can be reduced, thereby improving productivity and safety.

The ion implantation device of the present invention, in which an ion is generated from a predetermined source gas in a ion source and the ion is irradiated on a processing material in a form of beam, is characterized in that said source gas is supplied to said ion source from a gas cylinder provided in an external portion of the ion implantation device.

Therefore, the space where the gas cylinder is provided is not limited and a large-sized gas cylinder of, e.g., 47 l, in which the capacity of the contained gas is 7000 l in a standard state, can be used. Also, such a gas cylinder can be provided outside of the clean room.

Due to this, the frequencies of gas cylinder exchange can be largely reduced as compared with the prior art. Moreover, the frequencies of which the workers enter the clean room for exchanging the gas cylinder with a new one can be reduced, thereby improving productivity and removing danger which is brought about by exchanging the gas cylinder for a new one.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be explained with reference with FIGS. 1 and 2.

Figure 1:
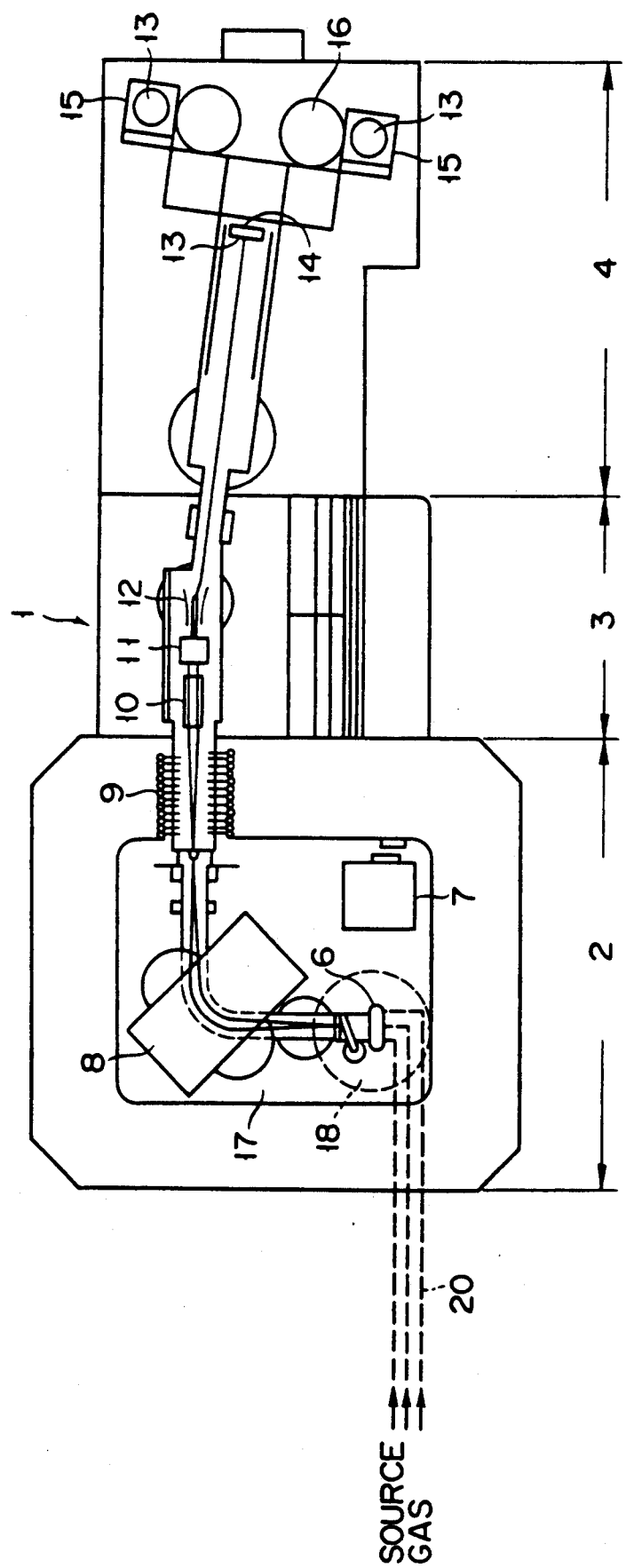
FIG. 1 is a schematic plane view showing the structure of an ion implantation device of one embodiment of the present invention.
Figure 2:
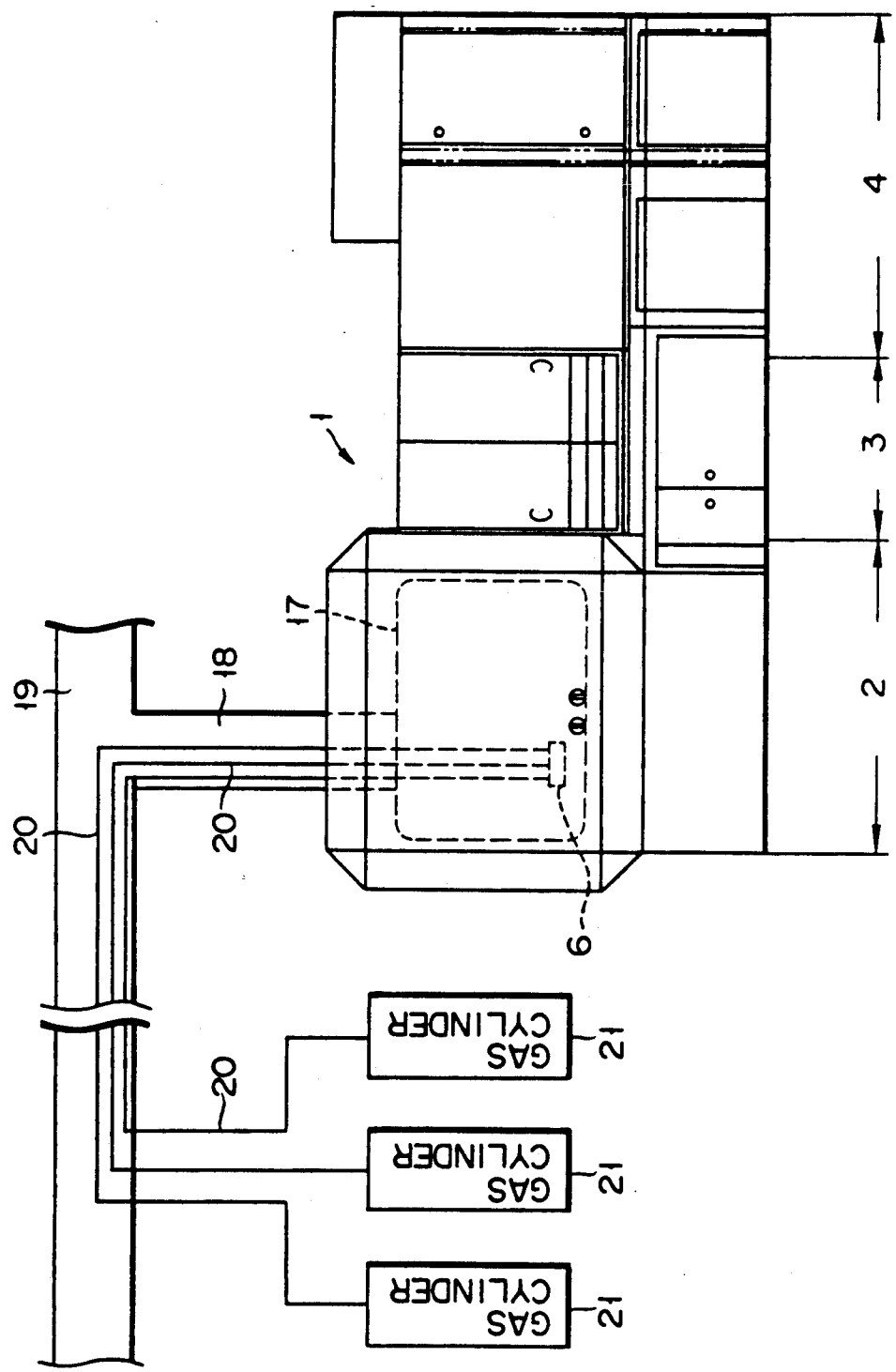
FIG. 2 is a schematic side view of the ion implantation device of FIG. 1.

As shown in FIG. 1, an ion implantation device 1 comprises three sections, which are horizontally arranged, that is, an ion source section 2, a beam line section 3, and an end station section 4. In the ion source 2, there are provided an ion source 6 (ion source of a hot-cathode type) for forming a plasma by discharging source gas, thereby generating ions, a power source 7 for supplying power to the ion source 6, a mass-spectrometry magnet 8 for deflecting the ion, which is generated from the ion source 6, by a magnetic field and selecting an ion, and an accelerating tube 9 for accelerating ion selected by the mass-spectrometry magnet 8.

Also, in the beam line 3 provided on the side of the ion source 2, there are provided a quadruple lens 10 for focusing the accelerated ion by the accelerating tube 9, a Y scanning electrode 11 and a X scanning electrode 12 for scanning the ion beam focused by the quadruple lens 10 in an X - Y direction, and so on.

Moreover, in the end station 4 provided on the side of the ion source 2, there are provided a processing material, for example, a semiconductor wafer 13, a platen 14 for holding the semiconductor wafer 13 to be at right angles to the incident direction of the ion beam or a predetermined tilt angle and a carrying mechanism 16 for sequentially loading or unloading the semiconductor wafer 13 on the platen 14 from a wafer cassette 15.

Furthermore, in the ion source 2, there is provided a cylindrical member, that is, an enclosure 17 for electrically isolating from these units in order to enclose around the ion source 6, the power source 7 for the ion source and the mass-spectrometry magnet 8. As shown in FIG. 2, an exhausting duct 18, which is a pipe formed of vinyl chloride having a diameter of 200 mm or more, is connected to the upper portion of the enclosure 17. The exhausting duct 18 is connected to, for example, an industrial exhausting system piping 19 which is provided on a ceiling.

According to the present invention, since a gas cylinder is provided outside of a clean room, the piping between the gas cylinder and the ion source is needed. In the exhausting duct 18, there are provided a plurality of pipes 20 for supplying source gas, having anti-corrosion, and being formed of stainless pipes having diameter of about several millimeters. In other words, the exhausting duct 18 pipes between the inside and outside of the clean room. That is, it is unnecessary to newly provide the piping between the gas cylinder and the clean room by use of the inside of exhausting duct 18.

One end of each of these pipes 20 is connected to one of various kinds of gas cylinders, which are provided outside of the ion implantation device 1 such as an engine room other than the clean room and which contain source gas such as $BF_3$, $PH_3$, $AsH_3$. Then, predetermined source gas is selectively supplied to the ion source 6 from these gas cylinders 21. In this case, the gas cylinders 21 are large-sized gas cylinders of, e.g., 47 l, in which the capacity of the contained gas is 7000 l in a standard state, is be used.

In the above-structured ion implantation device 1, the ion implantation is performed as follows.

The above-mentioned predetermined gas is supplied to the ion source 6 from the gas cylinders 21 via the pipes 20 in the exhausting duct 18, and power is supplied to the ion source 6 from the power source 7 thereby a plasma is formed and ion is generated. Then, the ion is deflected by the mass-spectrometry magnet 8 in order to be selected. The selected ion is accelerated by the accelerating tube 9 and is focused by the quadruple lens 10. Thereafter, the ion is scanned in an X - Y direction by the Y scanning electrode 11 and the X scanning electrode 12, and is irradiated on the semiconductor wafer 13 held by the platen 14.

In other words, the ion implantation device 1 of this embodiment is structured so that the source gas is supplied to the ion source 6 from the gas cylinders 21 provided outside of the ion implantation device 1. For this reason, unlike the conventional ion implantation device, in which the gas cylinder contained in the gas box, in the enclosure 17, there is no limit in the space where the gas cylinder is placed, and the large-sized gas cylinder can be used. Therefore, as compared with the prior art, the frequencies of the exchange of the gas cylinders can be largely reduced such as once a year. Moreover, the frequencies of which the workers enter the clean room in exchanging the gas cylinder is for a new one can be reduced, thereby productivity is largely improved, and danger, which is involved in the exchange of the gas cylinder, can be largely reduced.

Also, since there is no need that the gas cylinder is provided in the enclosure 17, the structure of the device becomes simple and the maintenance of the ion implantation can be improved. Also, the maintenance of the gas cylinders 21 can be carried out under the large space and the operation is easy.

In the above embodiment, the pipes 20 for supplying source gas are provided in the exhausting duct 18. This is because the change of design to be made when the conventional ion implantation device is applied to the present invention, are reduced as possible. In other words, conventionally the ion source 6 is enclosed by the enclosure 17, and the shield of the enclosure is broken in order to connect the pipes 20 to the ion source 6 from the portion other than the duct 18.

Also, a vacuum pump (not shown) is provided in the lower portion of the ion source 6. It can be considered that the pipes 20 are provided in the vacuum exhaust line of the vacuum pump. However, in this case, a flow resistance in the vacuum exhaust line is increased, so that an adverse influence may be exerted on degree of vacuum in the vicinity of the ion source 6.

The above embodiment has explained the example in which the present invention is applied to the ion implantation device of the medium current type. However, the present invention is not limited to the above embodiment. The present invention can, of course, be applied to any ion implantation devices such as a ion implantation device of a large current type and an ion implantation device of a very large current type, if the devices generate ions from the source gas. Moreover, in the above embodiment, the source gas is supplied from one gas cylinder to one ion implantation device. However, the source gas may be supplied from one gas cylinder to a plurality of ion implantation devices.

Furthermore, in the above embodiment, the pipes for supplying source gas are provided in the exhausting duct. However, a supply hole may be provided in the side wall of the exhausting dust. Also, the supply hole may be provided outside of the side wall of the exhausting dust.

According to the ion implantation device of the present invention, the frequencies of which the exchange of the gas cylinder can be largely reduced as compared with the prior art and the frequencies of which the workers enter the clean room in exchanging the gas cylinder for a new one can be reduced, thereby largely improving productivity can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An ion implantation device, wherein an ion is generated from a predetermined source gas in an ion source and the ion is irradiated on a processing material in a form of a beam, wherein said ion source is provided within an enclosure, and wherein said source gas is supplied to said ion source from a gas cylinder provided outside said enclosure.

2. An ion implantation device according to claim 1, wherein a gas supplying pipe is provided in an exhausting duct which connects inside of said enclosure, for electrically isolating units enclosing around the ion source of the ion implantation device, with an area outside the enclosure.

3. An ion implantation device according to claim 1, further comprising;
- a power source for supplying power to the ion source; and
- a mass-spectrometry magnet for deflecting the ion generated from the predetermined source gas;
- wherein said power source and said mass-spectrometry magnet are provided within said enclosure along with said ion source.

4. An ion implantation device, comprising:
- a clean room;
- an ion source in said clean room for generating an ion from a predetermined source gas;
- means within said clean room for irradiating the ion on a processing material in the form of a beam; and
- a gas cylinder provided externally to said clean room, said gas cylinder providing a supply of said source gas to said ion source.

5. An ion implantation device according to claim 4, wherein said clean room includes an exhausting duct, said exhausting duct containing a gas supplying pipe which supplies said source gas to said ion source from said gas cylinder.

* * * * *